United States Patent
Becker et al.

(10) Patent No.: US 9,671,696 B2
(45) Date of Patent: Jun. 6, 2017

(54) FLEXOGRAPHIC PRINTING ELEMENT WHICH CAN BE DIGITALLY IMAGED AND HAS A POLAR, ULTRA-THIN BARRIER LAYER

(71) Applicant: Flint Group Germany GmbH, Stuttgart (DE)

(72) Inventors: Armin Becker, Großniedesheim (DE); Matthias Beyer, Pfinztal (DE); Andreas Reifschneider, Mannheim (DE); Denis Riewe, Willstätt (DE); Uwe Stebani, Flörsheim-Dalsheim (DE)

(73) Assignee: Flint Group Germany GmbH (DE)

( * ) Notice: Subject to any disclaimer, the term of this patent is extended or adjusted under 35 U.S.C. 154(b) by 0 days.

(21) Appl. No.: 14/897,880

(22) PCT Filed: Jun. 12, 2014

(86) PCT No.: PCT/EP2014/062194
§ 371 (c)(1),
(2) Date: Dec. 11, 2015

(87) PCT Pub. No.: WO2014/198809
PCT Pub. Date: Dec. 18, 2014

(65) Prior Publication Data
US 2016/0131979 A1    May 12, 2016

(30) Foreign Application Priority Data
Jun. 14, 2013   (EP) .................... 13172084

(51) Int. Cl.
*B41N 1/12* (2006.01)
*G03F 7/40* (2006.01)
*G03F 7/09* (2006.01)
*G03F 7/32* (2006.01)

(52) U.S. Cl.
CPC ............. *G03F 7/40* (2013.01); *B41N 1/12* (2013.01); *G03F 7/092* (2013.01); *G03F 7/325* (2013.01)

(58) Field of Classification Search
CPC ................................................ G03F 7/40
See application file for complete search history.

(56) References Cited

U.S. PATENT DOCUMENTS

| | | |
|---|---|---|
| 4,722,355 A | 2/1988 | Moe et al. |
| 5,061,606 A | 10/1991 | Telser et al. |
| 5,262,275 A | 11/1993 | Fan |
| 2011/0023739 A1* | 2/2011 | Yoshimoto et al. ...... B41C 1/05 101/395 |
| 2012/0164584 A1 | 6/2012 | Recchia |
| 2013/0242276 A1 | 9/2013 | Schadebrodt et al. |
| 2016/0229172 A1 | 8/2016 | Stebani et al. |

FOREIGN PATENT DOCUMENTS

| | | |
|---|---|---|
| EP | 332070 A2 | 9/1989 |
| EP | 0697967 A1 | 2/1996 |
| EP | 1069475 A1 | 1/2001 |
| EP | 1156368 A2 | 11/2001 |
| EP | 2 128 702 A1 | 12/2009 |
| EP | 2284612 A1 | 2/2011 |
| WO | WO9426533 A1 * | 11/1994 |
| WO | WO-9426533 A1 | 11/1994 |
| WO | WO-2005/101130 A1 | 10/2005 |
| WO | WO-2008135865 A2 | 11/2008 |
| WO | WO-2012/010459 A1 | 1/2012 |
| WO | WO-2012/145111 A1 | 10/2012 |

OTHER PUBLICATIONS

International Search Report for PCT/EP2014/062194 mailed Sep. 8, 2014.

* cited by examiner

*Primary Examiner* — Chanceity Robinson
(74) *Attorney, Agent, or Firm* — Drinker Biddle & Reath LLP

(57) ABSTRACT

Digital imageable flexographic printing elements for producing flexographic printing plates, which are developable using hydrocarbon-comprising washout media and which, between the photopolymerizable layer and the digital imageable layer, have a polar, ultrathin, oxygen-blocking barrier layer. Methods for producing flexographic printing plates using such digital imageable flexographic printing elements, by imaging, exposing, washing out, drying, and post-treating, the washout being formed by means of hydrocarbon-comprising washout media.

14 Claims, No Drawings

FLEXOGRAPHIC PRINTING ELEMENT WHICH CAN BE DIGITALLY IMAGED AND HAS A POLAR, ULTRA-THIN BARRIER LAYER

CROSS-REFERENCE TO RELATED APPLICATIONS

This application is a national stage application (under 35 U.S.C. §371) of PCT/EP2014/062194, filed Jun. 12, 2014, which claims benefit of European Application No. 13172084.9, filed Jun. 14, 2013, both of which are incorporated herein by reference in their entirety.

The present invention relates to digitally imageable flexographic printing elements which can be used for producing flexographic printing plates and which are developable using hydrocarbon-comprising washout media, and which between the photopolymerizable layer and the digitally imageable layer have a polar, ultrathin, oxygen-blocking barrier layer. The invention further relates to a method for producing flexographic printing plates using such digitally imageable flexographic printing elements, by imaging, exposing, washing out, drying, and post-treating, the washout being performed by means of hydrocarbon-comprising washout media.

Digitally imageable flexographic printing elements are fundamentally known. They comprise at least dimensionally stable support, a photopolymerizable layer, and a digitally imageable layer. The digitally imageable layer may be, for example, a laser-ablatable layer, a layer writable by means of inkjet printers, or a thermographic layer, with laser-ablatable layers being the most common.

Laser-ablatable layers, also called LAM (laser-ablatable mask) layers, are opaque for the actinic light wavelength and customarily comprise a binder and also at least one IR absorber such as carbon black. Carbon black also causes the layer to be opaque. A mask can be written into the laser-ablatable layer using an IR laser—at but the areas at which it is struck by the laser beam, the layer is decomposed and the photopolymerizable layer disposed beneath it is exposed. The laser-ablatable mask layer may be applied directly to the photopolymerizable layer, or there may be further layers between the photopolymerizable layer and the laser-ablatable mask layer—a barrier layer, for example. Examples of the imaging of flexographic printing elements with IR-ablative masks are disclosed in U.S. Pat. No. 5,262,275 or EP-A 1 069 475, for instance.

Flexographic printing plates are produced from photopolymerizable, digitally imageable flexographic printing elements as follows: After a mask has been written into the digitally imageable layer, the flexographic printing element is exposed through the mask to UV radiation or UV/VIS radiation. The photopolymerizable layer undergoes polymerization in the regions no longer concealed by the mask, while in the concealed regions there is no polymerization. Following exposure, the remnants of the mask are removed along with the unpolymerized fractions of the photopolymerizable layer. This removal may take place using one or more solvents or else thermally. If using solvents, a drying step is added. The resulting flexographic printing plate is customarily also post-treated, by exposure to UVA and/or UVC light, for instance.

In the case of digitally imageable flexographic printing elements, the main exposure using UV or UV/VIS radiation takes place customarily in the presence of atmospheric oxygen.

The presence of oxygen at main exposure is known to have a very considerable influence on the form of the printing relief elements, especially on the form of fine halftone elements. Molecular oxygen, as is known, is a diradical and is therefore able to react with other radicals. As a result of the presence of molecular oxygen during the UV-light-initiated radical polymerization, the oxygen interrupts the radical chain reaction on the surface of the photopolymerizable layer, with the consequence that the surface of the relief element is no longer adequately polymerized. Regions of the photopolymerizable layer that are situated further beneath the surface are less affected. In the course of the development of the layer after the polymerization, the layers which have not been sufficiently polymerized are likewise removed. The relief elements are therefore smaller than they actually ought to be, and have rounded corners. This effect is illustrated in EP-A 2 128 702, page 15, FIG. 1, for instance.

The destructive influence of oxygen during the exposure of the flexographic printing elements ought fundamentally to be ruled out, so that the intended relief elements are polymerized fully through to the surface and hence relatively fine details of the plate can be imaged and very fine structures can be imaged in solid areas. This serves in particular for improving ink transfer and ink lay.

Proposals have therefore been made to protect the photopolymerizable layer from oxygen during the main exposure. It is possible in principle to carry out exposure under inert gas or using a vacuum frame, though such a procedure entails additional apparatus expense and/or complexity, and is therefore usually avoided.

Proposals have also been made to protect the photopolymerizable layer in flexographic printing elements from atmospheric oxygen by means of additional barrier layers. Such barrier layers are intended to prevent or at least minimize the diffusion of oxygen into the photopolymerizable layer.

U.S. Pat. No. 5,262,275 discloses flexographic printing elements for producing flexographic printing plates, comprising a support, a photopolymerizable layer, a barrier layer applied thereon, and a laser-ablatable mask layer applied thereon.

The barrier layer is intended on the one hand to prevent the migration of components, such as of monomers, from the photopolymerizable layer into the laser-ablatable layer, and on the other hand to protect the photopolymerizable layer from atmospheric oxygen during exposure of the flexographic printing element. Both photopolymerizable and non-photopolymerizable barrier layers are proposed. Materials proposed for nonphotopolymerizable barrier layers include both water-soluble binders and binders that are soluble in organic solvents, such binders being polyamides, polyvinyl alcohol, hydroxyalkylcellulose, ethylene-vinyl acetate copolymers, amphoteric interpolymers, and combinations thereof. The thickness of the barrier layer is generally 0.25 µm to 76 µm, preferably 0.38 to 64 µm.

WO 2012/145111 discloses photopolymerizable flexographic printing elements, for producing flexographic printing plates, comprising a support, a photopolymerizable layer, a barrier layer applied thereon, and a laser-ablatable layer applied thereon. The barrier layer has a diffusion coefficient for $O_2$ of less than $6.9*10^{-9}$ $m^2/s$ and an optical transparency of at least 50%, preferably at least 75%. The thickness of the barrier layer is 1 to 100 µm, preferably 1 to 20 µm. Materials proposed for the barrier layer include both water-soluble binders and binders that are soluble in organic solvents, such binders being polyamides, polyvinyl alcohol, hydroxyalkylcellulose, polyvinylpyrrolidone, ethylene-vinyl acetate copolymers, amphoteric interpolymers, cellulose acetate butyrate, alkylcellulose, butyral, cyclic rubbers, or combinations thereof.

US 2012/0164584 discloses a method for producing flexographic printing plates using a digitally imageable flexographic printing element which has a laser-ablatable layer. After a mask has been written into the laser-ablatable layer, a barrier layer is applied to the upper face of the flexographic printing element, meaning that it covers not only the exposed areas of the photopolymerizable layer but also those regions of the laser-ablatable layer itself that are still present. This is followed by exposure to UV light. Materials proposed for the barrier layer include both water-soluble binders and binders that are soluble in organic solvents, such binders being polyamides, polyvinyl alcohol, hydroxyalkylcellulose, polyvinylpyrrolidone, ethylene-vinyl acetate copolymers, amphoteric interpolymers, cellulose acetate butyrate, alkylcellulose, butyral, cyclic rubbers, or combinations thereof. Oils are a further option. The thickness of the barrier layer is 1 to 100 µm, preferably 1 to 20 µm. The application of the barrier layer signifies an additional method step between imaging and exposure, and therefore additional cost and complexity.

WO 2005/101130 (Kodak) discloses a multilayer mask film for producing flexographic printing plates. The mask film comprises a support, an IR-sensitive layer, an IR-ablative layer for example, and also, optionally, further layers, such as a barrier layer or a release layer, for instance. The mask film can be imaged with a laser, and is subsequently laminated to a photopolymerizable flexographic printing element, with the support layer of the mask film forming the uppermost layer. The mask layer assembly is subsequently exposed over its whole area, with the option of exposure through the support layer or of removal of the support layer prior to exposure. Following exposure, the support film (if not already removed) can be removed either with or without the mask layer proper, and the exposed flexographic printing element can be developed conventionally.

Laminating processes such as the subsequent application of an oxygen-blocking film or the subsequent application of a previously exposed mask film are inadvisable, since defects may arise during each lamination, as a result of inclusion of dust particles or inclusion of air, for example. Any defect, however small, renders the flexographic plate unusable, however. Furthermore, laminating or the subsequent application of barrier layers are an additional workstep in the processing of the flexographic printing element, and are therefore extremely undesirable from the user standpoint.

In the prior art, furthermore, there are specialty exposure techniques known, from WO 2012/010459 or WO 2008/135865, for example, in which the flexographic printing elements are exposed using intensive UVA-LED radiation. The high energy of the exposure and the rapid polymerization that ensues minimize the effect of disruptive oxygen, and even fine surface structures on the flexographic printing plates can be imaged. The exposure apparatus, however, is much more expensive than standard commercial UVA tube exposure units. Furthermore, the imaging of fine details necessitates relatively long exposure times, so further hindering the acceptance of this technology within the market.

In spite of other proposals, therefore, a flexographic printing element which comprises, between the laser-ablatable mask layer and the photopolymerizable relief layer, a barrier layer which prevents or at least significantly reduces the ingress of atmospheric oxygen into the photopolymerizable layer during UV exposure continues to be an interesting solution proposal.

Nevertheless, the use of barrier layers is also attended by a series of hitherto unresolved problems.

While there are a range of materials whose permeability for molecular oxygen is low and whose use as barrier layers in flexographic printing elements is therefore conceivable in principle, the processing of such flexographic printing elements in standard commercial processing equipment, using standard commercial washout media, nevertheless imposes a series of additional requirements on the barrier layer, with the consequence that it is not possible to use just any materials possessing low permeability for molecular oxygen.

The photopolymerizable layers of customary flexographic printing elements comprise substantially nonpolar binders, such as styrene-butadiene-styrene block copolymers or styrene-isoprene-styrene block copolymers, for example, and also other nonpolar components.

The laser-ablatable mask layer customarily likewise comprises elastomeric binders which are soluble in organic solvents such as soft elastic polyamides, for example.

Typical flexographic washout media therefore comprise a nonpolar main component (hydrocarbon solvent) to dissolve the photopolymerizable layer, and an alcohol of medium polarity (e.g., benzyl alcohol) to dissolve the laser-ablatable mask layer. Polar binders, however, cannot be dissolved in a flexographic washout medium of this kind.

Materials having a low permeability for oxygen are frequently polar substances, which, accordingly, are soluble only in water or in water/alcohol mixtures.

With regard to the washout of exposed flexographic printing elements, therefore, the combination of a nonpolar laser-ablatable layer and a nonpolar photopolymerizable layer with a polar barrier layer is extremely undesirable, since polar barrier layers cannot be dissolved in the largely nonpolar flexographic washout media that are the market standard.

If a flexographic printing element includes a polar barrier layer, washout must then be performed in two or even three steps. Using, for example, a laser-ablatable mask layer composed of a soft elastic polyamide and carbon black, as per the prior art, and a polar barrier layer, washout requires the use first of benzyl alcohol (to dissolve the mask layer), then of water (to dissolve the barrier layer), and finally of a hydrocarbon solvent (to dissolve the photopolymerizable layer). This is extremely uneconomic and is not accepted by the market.

The usual technologies for the imaging of flexographic printing elements with laser-ablatable mask layers have also imposed requirements on the barrier layer.

In the processing of a flexographic printing element, with the customary sequence of support film—photopolymerizable layer—barrier layer—laser-ablatable layer—top film/protective film layers, the top film/protective film is removed first of all. This film should be easy to peel from the laser-ablatable mask layer, the requirement being for the adhesion of the laser-ablatable mask layer to the barrier layer and the adhesion of the barrier layer to the photopolymerizable layer to be such that both remain fully on the photopolymerizable layer.

Commercial laser apparatus for imaging includes a rotating drum onto which the flexographic printing element—with the laser-ablatable layer outward—must be stretched. Application to the drum requires the flexographic printing element to flex in accordance with the curvature of the drum, a process in which the surface of the flexographic printing element is inevitably stretched. During this operation, neither the laser-ablatable mask layer nor the underlying barrier layer may tear.

After imaging has taken place, the flexographic printing element is demounted from the laser drum and exposed to UV light in an exposure unit. With the commercial UV exposure units, this is done with the flexographic printing element in the flat state—in other words, for washout, the flexographic printing element must be straightened again.

During this straightening, neither the rest of the mask layer nor the barrier layer may wrinkle or develop structure, since these structures would be imaged into the photopolymerizable layer in the course of the subsequent UV exposure. Polar materials with low permeability for molecular oxygen, however, are generally extremely brittle. Barrier layers made from brittle materials of this kind tear if stretched during mounting to the laser drum, and exhibit unwanted corrugations after demounting from the laser drum.

It was an object of the invention to provide flexographic printing elements having a barrier layer for oxygen which can be mounted to and demounted from the drum of a laser apparatus for imaging, without damage, and which following exposure can be washed out in commercial, largely nonpolar flexographic washout media.

Surprisingly it has been found that flexographic printing elements having polar, ultrathin barrier layers meet these requirements. The object is achieved by the technical teaching described in the claims.

Found accordingly has been a digitally imageable, photopolymerizable, flexographic printing element, which is developable using hydrocarbon-comprising washout media and which is intended for producing flexographic printing plates and comprises, disposed one above another in the order stated, at least (A) a dimensionally stable support film having a thickness from 50 µm to 300 µm, (B) a photopolymerizable, relief-forming layer from 300 µm to 6000 µm in thickness, which is soluble or dispersible in organic solvents and which comprises at least one elastomeric binder, an ethylenically unsaturated monomer, (as structural unit) and a photoinitiator or a photoinitiator system, (C) a transparent barrier layer for oxygen, (D) a laser-ablatable mask layer from 1 µm to 4 µm in thickness, which is soluble or dispersible in organic solvents and comprises at least an elastic binder and UV/VIS light-absorbing materials, the layer thickness and/or the amount of light-absorbing materials being made such that the optical density of the layer for UV/VIS radiation is 2 to 4, and (E) a removable top film, the barrier layer (C) being polar and being soluble in water and/or in water/alcohol mixtures comprising at least 50 wt % of water, and the barrier layer (C) having a thickness from 10 nm to 999 nm.

Also found has been a method for producing flexographic printing plates, using as starting material a flexographic printing element of this kind, comprising at least the following method steps:

(1) removing the top film (E), (2) writing a mask into the laser-ablatable mask layer (D) by means of an IR laser, (3) exposing the imaged flexographic printing element to UV or UV-VIS radiation through the resultant mask, (4) removing the remnants of the laser-ablatable mask layer (E), the protective layer (X) where present, and the barrier layer (C) and also the unpolymerized fractions of the relief-forming layer (B), using a washout medium which comprises at least 60 wt % hydrocarbons, (5) drying the resultant flexographic printing plate, and (6) carrying out post-treatment with UV-A and/or UV-C light.

Details of the invention now follow:

In the text below, the term "flexographic printing plate" is used for a print-ready printing plate that has already been crosslinked. The term "flexographic printing element" is used, conventionally, for the photopolymerizable starting material which is employed for producing flexographic printing plates.

The nature of the digitally imageable flexographic printing element of the invention is such that following imagewise exposure, it can be developed using washout media comprising one or more hydrocarbons.

Support Film (A)

The flexographic printing element of the invention comprises, in a manner known in principle, a dimensionally stable support film (A) of a thickness of preferably 50 µm to 300 µm. The material of the support film may comprise, for example, steel or aluminum, or plastics such as polyethylene terephthalate, polybutylene terephthalate, polyethylene naphthalate, or polycarbonate, for example. Especially suitable are PET films having a thickness from 100 to 200 µm.

The support films may optionally have been treated with customary adhesion-promoting layers.

Relief-Forming Layer (B)

The flexographic printing element further comprises at least one photopolymerizable, relief-forming layer (B) from 300 µm to 6000 µm thick which is soluble or dispersible in organic solvents and which comprises at least one elastomeric binder, (at least) one ethylenically unsaturated monomer, and a photoinitiator or photoinitiator system. Besides the stated components, there may also be further components optionally present, such as plasticizers, for example. The elastomeric binders may comprise, for example, thermoplastic-elastomeric block copolymers, examples being styrene-butadiene or styrene-isoprene block copolymers. Compositions for relief-forming layers that are soluble or at least dispersible in organic solvents are known in principle to the skilled person. That person selects an appropriate composition according to the desired properties of the flexographic printing plate.

The flexographic printing element of the invention may also comprise a plurality or photopolymerizable, relief-forming layers which are soluble or dispersible in organic solvents, one above another. Flexographic printing elements having a multilayer construction of the photopolymerizable, relief-forming layer are likewise known to the skilled person.

The relief-forming layer (B) preferably comprises a layer which is soluble or at least dispersible in hydrocarbons or in hydrocarbon-comprising organic solvent mixtures. More particularly the relief-forming layer is a layer which is soluble in organic solvent mixtures comprising at least 60 wt % hydrocarbons, preferably at least 75 wt % hydrocarbons.

The polarity of the organic solvents can be described, in a manner known in principle, through what is called the solubility parameter (Hansen solubility parameters, J. Appl. Polym. Sci., 5 (15), 339 (1961)). In one preferred embodiment of the invention, the relief-forming layer (B) comprises a layer soluble in organic solvents and/or solvent mixtures having a solubility parameter <11 $(cal/cm^3)^{1/2}$.

Top Film (E)

The removable top film (E) is the uppermost layer of the flexographic printing element and serves for purposes including the protection of the flexographic printing element. The top film is removed before the flexographic printing element is used for producing flexographic printing plates. Particularly suitable removable top films (E) are PET films having low or moderate roughness. Typical Rz values ought to be below 1 μm. A Mylar® A PET film can be used, for example.

Laser-Ablatable Mask Layer (D)

The laser-ablatable mask layer (D) that is soluble or dispersible in organic binders, also called LAM layer, comprises at least one elastic binder, more particular soft elastic binders. Mixtures of two or more different binders can of course also be used.

The elastic binders give the laser-ablatable mask layer (D) sufficient flexibility and stretch, so that the layer does not tear or wrinkle on mounting to the drum of a laser apparatus. Moreover, effective adhesion to underlying layers ought to be ensured.

Examples of suitable binders include soft elastic polyamides. Monomeric structural units included in such polyamides are long-chain, bifunctional fatty acids, which give the polyamide soft elastic qualities. In addition, polyester amides, cellulose derivatives, nitrocellulose, ethylene-vinyl acetate copolymers, polyacrylates, or mixtures of said polymers may be used, provided they possess soft elastic properties.

In one preferred embodiment of the invention, the binders in question are soluble in organic solvents, more particularly in organic solvents of moderate polarity. Examples of solvents of moderate polarity include, in particular, monofunctional or polyfunctional alcohols with $C_4$ to $C_{12}$ hydrocarbon radicals. The polarity of the solvents can be described in a manner known in principle by the solubility parameter (Hansen solubility parameters, J. Appl. Polym. Sci., 5 (15), 339 (1961)). The stated alcohols have solubility parameters in a range from 9 to 12 $(cal/cm^3)^{1/2}$.

In the case of layers with binders of this kind, the remnants of the laser-ablatable mask layer after imaging and imagewise exposure can be dissolved or washed off using standard commercial flexographic washout media, comprising nonpolar hydrocarbons and moderately polar alcohols (e.g., Nylosolv® product from Flint Group).

A particularly suitable binder for the laser-ablatable mask layer is Makromelt® 6900 (Henkel AG), a soft elastic polyamide.

The laser-ablatable mask layer (D) further comprises UV/VIS light-absorbing materials, the layer thickness and/or the amount of the light-absorbing materials being made such that the optical density of the layer for UV/VIS radiation is 2 to 4. The high optical density ensures that the regions of the relief-forming layer covered by the mask do not undergo polymerization in the course of the full-area exposure.

The optical density is the logarithmic coefficient for the light transmissibility of the layer within this wavelength range. In the measurement of the optical density, therefore, there is no single value for the light permeability found at a particular wavelength; instead, an average of the light transmittances in a defined wavelength range is obtained. The optical density is customarily measured using commercially available densitometers (e.g., from x-rite), with the wavelength range being selected prior to measurement. This wavelength range generally encompasses the range from 300 to 400 nm.

Particularly suitable light-absorbing material comprises finely divided carbon black. Carbon black absorbs very well in the IR range as well, and therefore also ensures rapid imaging simultaneously in the case of imaging using IR lasers. Of course, however, the laser-ablatable mask layer may also comprise other pigment-based UV or IR absorbers, or soluble dyes. Carbon black is customarily present in an amount of 10 to 50 wt %, based on the sum of all the components.

The thickness of the mask layer ought to be a few μm, preferably 1 μm to 4 μm. At layer thicknesses below 1 μm it is difficult to achieve a sufficient optical density. At layer thicknesses above 3 μm, the laser sensitivity of the element is too low, meaning that long laser times are necessary for imaging.

The laser sensitivity of the mask layer (measured as the energy needed in order to ablate 1 $cm^2$ of layer) ought to be between 1 and 4 $mJ/cm^2$, with a figure of about 2 $mJ/cm^2$ being optimum.

Barrier Layer for Oxygen (C)

The flexographic printing element of the invention further comprises a transparent barrier layer (C) for oxygen, which is disposed on the photopolymerizable layer.

The function of the barrier layer (C) is to prevent—in a manner known in principle—the after-diffusion of oxygen into the relief-forming layer (B) in the course of the full-area exposure of the flexographic printing element. The oxygen permeability of the barrier layer ought preferably to be less than 100, preferably less than 10 $(cm^3 \times 100$ μm$)/(m^2 \times d \times$ bar$)$.

In accordance with the invention the barrier layer is a polar layer.

"Polar" means that the barrier layer is soluble in water and/or in water/alcohol mixtures comprising at least 50 wt %, preferably at least 70 wt %, more preferably at least 80 wt %, and, for example, at least 90 wt % water. The alcohols in said alcohol/water mixtures are water-miscible, aliphatic monoalcohols selected from the group consisting of methanol, ethanol, n-propanol, and isopropanol.

For the barrier layer it is possible in principle to use any polar material with which low oxygen permeability is achievable and with which, more particularly, it is possible to stay within the oxygen permeabilities indicated above.

In one embodiment of the invention, the materials for the barrier layer are polymeric materials. Examples of suitable polymers include polymers from the class of the polyvinyl alcohols, partly and highly hydrolyzed polyvinyl carboxylates, especially partly and highly hydrolyzed polyvinyl acetates, poly(ethylene oxide-vinyl alcohol) graft copolymers, poly(ethylene-vinyl alcohol) copolymers, water-soluble polyamides, or water-soluble polyvinylpyrrolidones.

The material of the barrier layer preferably comprises at least one material selected from the group consisting of polyvinyl alcohol, partly and highly hydrolyzed polyvinyl carboxylate, especially partly and highly hydrolyzed polyvinyl acetate, poly(ethylene oxide-vinyl alcohol) graft copolymers, and water-soluble poly(ethylene-vinyl alcohol) copolymers.

Polyvinyl alcohols are prepared by polymerization of vinyl carboxylates, more particularly vinyl acetates, to give polyvinyl carboxylates, more particularly polyvinyl acetates, followed by hydrolysis of the vinyl carboxylate units to give vinyl alcohol units. The polymers obtained are generally characterized by their degree of hydrolysis. "Polyvinyl alcohols", accordingly, are not only polymers which comprise exclusively vinyl alcohol units, but also copolymers composed of vinyl carboxylate units and vinyl alcohol units.

Termed "partly hydrolyzed" in the sense of this invention are poly(vinyl carboxylate-vinyl alcohol) copolymers, more particularly poly(vinyl acetate-vinyl alcohol) copolymers, having a vinyl alcohol unit content of at least 50 mol % in respect of all monomers.

Termed "highly hydrolyzed" in the sense of this invention are poly(vinyl carboxylate-vinyl alcohol) copolymers, more particularly poly(vinyl acetate-vinyl alcohol) copolymers, having a vinyl alcohol unit content of at least 70 mol % in respect of all monomers.

Termed "polyvinyl alcohols" in the sense of this invention are polyvinyl alcohol homopolymers or poly(vinyl carboxylate-vinyl alcohol) copolymers, more particularly poly(vinyl acetate-vinyl alcohol) copolymers, having a vinyl alcohol unit content of at least 90 mol % in respect of all monomers.

With particular preference the material of the barrier layer comprises materials selected from the group consisting of highly hydrolyzed polyvinyl carboxylates, polyvinyl alcohols, or ethylene-vinyl alcohol copolymers having a vinyl alcohol unit fraction of more than 70%; polyvinyl alcohols are especially preferred.

Besides the stated polymeric materials, the barrier layers may also comprise further components. Materials of these kinds can be used in order to modify the properties of the barrier layer. Additional components may in particular be polar plasticizers. Examples of such plasticizers include glycol, glycerol, or polyethylene glycols. The amount of the plasticizers is determined by the skilled person according to the desired properties of the layer. In general, however, it is not more than 20 wt %, based on the amount of all the components of the barrier layer. Examples of further components include auxiliaries can for stabilizing against unwanted crosslinking. These auxiliaries prevent the barrier layers crosslinking on irradiation with actinic light and so possibly being no longer removable on washout. Auxiliaries of this kind may be, for example, Xyligen potassium salts in an amount of 0.1 to 5 wt % in combination with small concentrations of dyes.

In a further embodiment of the invention, the barrier layer (C) comprises inorganic, polar layers of metal and/or nonmetal oxides. The inorganic oxides may be applied from solution, from dispersion, or by sputtering. Especially suitable are coatings based on silicon oxides of the kind also used for oxygen-barrier packaging films.

In accordance with the invention the barrier layer (C) has a thickness from 10 nm to 999 nm, as for example 100 nm to 999 nm, preferably 100 to 400 nm, and more preferably 100 to 249 nm.

The minimum thickness of the barrier layer is dependent on factors including the material from which the barrier layer is made. For layers of metal or nonmetal oxides which are applied by sputtering, a layer of just 10 nm may be sufficient. For barrier layers made from polymeric binders it is advisable to provide a layer thickness of at least 100 nm.

Since the materials described for the barrier layer (C) are polar, they are insoluble—as such—on commercial nonpolar, organic washout media for flexographic printing plates. Commercial organic solvents generally comprise at least 60 wt % hydrocarbons.

Furthermore, in comparison to the photopolymerizable layer (B), the materials described are relatively hard and brittle. Applied in substantial layer thicknesses of just a few μm, they tear on mounting to the laser drum.

All the more surprising is the finding that after imagewise exposure and in spite of the polar barrier layer (C), the flexographic printing elements of the invention could be readily washed out using hydrocarbon-comprising washout media. Even the ultrathin polar barrier layer is removed on washout in said nonpolar washout media.

Also surprisingly, the flexographic printing elements of the invention, in spite of the relatively hard and brittle materials of the barrier layer, can be stretched without tearing on mounting to the laser drum.

Evaluation of the flexographic printing plates obtained using the flexographic printing elements of the invention further demonstrates that the ultrathin barrier layers (C) adequately block oxygen and it is possible to obtain flexographic printing plates having ultrahigh detail reproduction and superfine surface structures.

Protective Layer (X)

In the case of imaging using IR laser, the mask layer is heated very highly in the area on which it is struck by the laser beam, causing the components of the layer to undergo decomposition. In this case, very high temperatures, in some cases of several thousand degrees Celsius, may be generated locally in the mask layer. In some scenarios these temperatures may also attack the very thin barrier layer (C). This is undesirable since it robs the underlying relief-forming layer (B) of subsequent protection from the influence of oxygen.

Optionally, therefore, the flexographic printing element of the invention further comprises a transparent layer (X) which is disposed between the layers (C) and (D) and whose function is to protect the ultrathin barrier layer (C) disposed beneath the layer (X) from damage due to laser radiation in the course of imaging.

The protective layer (X) is transparent or at least largely transparent for UV/VIS radiation, and so the full-area exposure of the relief-forming layer through the layer (X) is not disrupted. Both the barrier layer (C) and the protective layer (X) ought to have a transparency of at least 80% in the UV/VIS range.

The protective layer (X) comprises at least one elastic, more particularly a soft elastic, polymeric binder. This binder is different from binders possibly used in the barrier layer (C). Of course it is also possible for mixtures of different binders to be used.

In one preferred embodiment of the invention, the binders in question are binders which are soluble in organic solvents, more particularly organic solvents of moderate polarity—as defined above.

The binder may comprise, for example, soft elastic polyamides (for example, Makromelt® 6900 (Henkel)), which at the same time may also be binders of the laser-ablatable mask layer (D).

The thickness of the transparent protective layer (X) ought to be between 0.1 μm and 4 μm, preferably 0.1 μm and 2.5 μm. If the layer thickness selected is too small, the underlying barrier layer may in some cases be attacked. If the layer thickness is too high, there may be scattering effects detrimental to the imaging of fine negative elements of the flexographic printing plates.

Production of the Flexographic Printing Elements

The flexographic printing elements of the invention are produced in a manner known in principle, by melting of the components of the photopolymerizable layer in an extruder, mixing of the melted components, and discharge of the melt of the photopolymerizable material through a slot die into the nip of a calender. Running in over one calender roll is a support film, which may optionally have been coated with further layers, such as an adhesion layer, and running in over the other calender roll is the prefabricated top element.

To produce the top element, the top film (F) is first coated with the laser-ablatable mask layer (D) and then overlaid with barrier layer (C). If the flexographic printing element is to include, optionally, a protective layer (X), the top film (F) is first coated with the laser-ablatable mask layer (D), then overlaid with the protective layer (X) and, lastly, with the barrier layer (C).

The individual layers may be applied by dissolving the components of the layers in suitable solvents or solvent mixtures, casting the solutions in succession, and evaporating the solvent in each case. Prior to application of each subsequent layer, it may be necessary for the target surface to be roughened by corona pretreatment, in order to achieve improved layer attachment.

The solvents to be used for producing casting solutions are guided by the nature of the layer. The laser-ablatable mask layer (D) is soluble in organic solvents, preferably in the defined organic solvents of moderate polarity, and, accordingly, solvents of this kind can be used for dissolving the components of the casting solution. A protective layer (X), present optionally, may be applied analogously.

The polar barrier layers may be applied from the water/alcohol mixtures described, preferably water. This is advantageous since as a result there is no attack on the mask layer (D), which is soluble in organic solvents, or on an optionally present protective layer (X).

Casting techniques for the application of layers are known to the skilled person. The thickness of the layers to be applied can be reduced in a manner known in principle by dilution of the casting solution. In order to improve the quality of coating it may be necessary to add surface-active substances or flow control assistants to the coating solution.

Barrier layers (C) of metal or nonmetal oxides, $SiO_x$ layers for example, may also be applied by sputtering. Sputtering for coating is likewise known to the skilled person. Sputtering is not detrimental to the coating quality of the layers applied beforehand.

In the case of sputtering, the layer thickness can be reduced in a manner known in principle by raising the speed of travel while maintaining a constant sputter dose (quantity/area/unit time). For this purpose, solid $SiO_2$ (generally sand) is bombarded with an electron beam under a high vacuum, causing it to sublime and to diffuse upward in the gaseous state on account of the differences in density and temperature. The $SiO_x$ gas condenses again on the target substrate and forms a thin layer of $SiO_x$ on the substrate, this layer adhering very well in the majority of cases.

The uniformity of application of the ultrathin barrier layer (C) may be monitored with the appearance of Newton's rings, since the light wavelength is in the range of the thickness of the barrier layer. In the case of the very thin layers treated here, this layer thickness is determined via an optical method, spectral reflection. This involves the thickness being determined by the reflection of light of different wavelengths from the top and bottom faces of the layer.

The coated top element is rolled up and is introduced via one of the calender rolls in the course of the subsequent extrusion, and thus is joined firmly to the photopolymerizable layer.

Alternatively, parts of the top element may also be laminated on in a plurality of steps. For example a top element composed of an ultrathin barrier layer (C) on a temporary auxiliary film may be introduced via the calender rolls and joined to the photopolymerizable layer. The auxiliary film is subsequently removed. Then, in a second laminating step, the laser-ablatable mask layer is laminated to the top film proper. In order to improve the adhesion of the layers to one another, it may be necessary to treat the flexographic printing element produced with a low dose of electron beams.

Use of the Flexographic Printing Elements for Producing Flexographic Printing Plates The method of the invention for producing flexographic printing plates using the digitally imageable flexographic printing elements described preferably comprises method steps (1) to (6). The method may optionally also comprise further method steps.

In method step (1), in a manner known in principle, the top film (E) is removed from the flexographic printing element.

In method step (2), in a manner known in principle, a mask is written into the laser-ablatable mask layer (D) by means of an IR laser. Laser apparatus for writing of masks is known to the skilled person and is available commercially. In principle it is possible for any commercial lasers (primarily external drum lasers) to be used.

In one embodiment of the invention, method step (2) can be performed using a laser apparatus comprising a rotatable drum. For imaging, the flexographic printing element is mounted—with the support film facing the drum—to the drum. It is self-evident that in this case the flexographic printing element is bent, and the barrier layer, correspondingly, undergoes some stretching. In spite of the relatively hard and brittle materials of the barrier layer, the flexographic printing elements of the invention are able to stretch on mounting to the laser drum, without tearing.

In method step (3), the imaged flexographic printing element is exposed through the resultant mask to UV or UV-VIS radiation, in a manner known in principle. In this operation, the photopolymerizable layer undergoes polymerization in those regions no longer hidden by the mask, whereas there is no polymerization in the hidden regions. The photopolymerizable layer is protected from the effect of after-diffusing oxygen during exposure by the barrier layer (C).

Apparatus for exposing flexographic printing plates is known in principle to the skilled person. The flexographic printing elements can be exposed using standard commercial tube exposure units. High-energy UV-LED strips need not be used, but can be employed at any time. In one embodiment of the invention, a flatbed exposure unit is used for method step (3). For this purpose, the flexographic printing element, if it has been exposed by means of a drum laser in method step (2), must be flattened again, something which causes no problems with the flexographic printing elements of the invention.

In method step (4), the remnants of the laser-ablatable mask layer (E), the protective layer (X) where present, and the barrier layer (C), and also the unpolymerized fractions of the relief-forming layer (B), are removed using a washout medium which comprises at least 60 wt % hydrocarbons. This can be done using customary washout equipment, more particularly using flatbed washout equipment. The hydrocarbons may in particular be high-boiling aliphatic, cycloaliphatic, or aromatic hydrocarbon fractions, more particularly those having a boiling range of 160 to 220° C.

In one preferred embodiment of the invention, the washout medium comprises 60 to 95 wt % of hydrocarbons and 5 to 40 wt % of alcohols. It is self-evident that the alcohols are those which are miscible with the hydrocarbons. Used in general are monoalcohols having at least 4 carbon atoms, preferably at least 5 carbon atoms, as for example 5 to 10 carbon atoms. Examples include n-pentanol, cyclohexanol, benzyl alcohol, heptyl alcohols, or 2-ethylhexanol.

It is possible for example to use the flexographic washout media described in EP-A 332 070. Suitable washout media are available commercially. The majority of the washout media used in the market comprise nonpolar hydrocarbons as main component and also alcohols of moderate polarity in an amount of 10 to 30 wt %. Examples of commercial washout media comprise mixtures containing about 40 wt % of high-boiling hydrocarbon solvents, about 40 wt % decalin and about 20 wt % n-pentanol; mixtures containing about 50 wt % high-boiling hydrocarbon solvents, about 20 wt % diisopropylbenzene, and about 30 wt % cyclohexanol; mixtures containing 56 wt % decalin, about 27 wt % aliphatic hydrocarbon solvent, about 12 wt % benzyl alcohol, and about 2 wt % ethylhexanol; and also mixtures containing about 70 wt % aromatic hydrocarbons and about 30 wt % heptyl alcohols.

Surprisingly even the ultrathin polar barrier layer (C) is removed fully when using the nonpolar washout media described.

In method step (5), the resultant flexographic printing plate is dried in a manner known in principle, and in method step (6) it is post-treated in a manner known in principle with UV-A and/or UV-C light.

It is of course also possible to process the flexographic printing elements of the invention to flexographic printing plates by other methods. Also possible, of course, is a multistage development using different solvents or solvent mixtures. It is also possible for the exposed flexographic printing element to be developed not using washout media, but instead thermally.

The invention is elucidated in more detail in the examples below.

COMPARATIVE EXAMPLE 1

Digitally Imageable Flexographic Printing Element without Barrier Layer

A commercial, digitally imageable flexographic printing element having an organically developable photopolymerizable layer (Nyloflex® ACE 114 D) was used. The thickness of the mask layer is 3.2 µm and the optical density of the mask layer is 3.7.

The flexographic printing element was first of all pre-exposed for 10 seconds on the reverse side. The top film was peeled off. Following the pre-exposure, a test motif was written into the mask layer of the flexographic printing element by means of an IR laser. As a result of the mask layer still remaining, the nonimage regions here remain UV-impermeable, whereas the removal of the mask in the image regions enables the curing of the photopolymerizable relief layer by means of actinic radiation. Imaging of the digital mask was performed by means of a "nano" ablation laser system from Flexolaser GmbH, the mask resolution used being 2540 dpi.

The plate thus prepared was subsequently exposed to actinic radiation for 14 minutes (Nyloflex® F III exposure unit, Flint Group) and then developed.

The solvent-based development of the imagewise-exposed flexographic printing plates was carried out, at the washout rate reported in each case and with the brush position recommended for the particular product type, by means of a Nyloflex® F III washout apparatus. The washout medium used was a commercial washout medium composed of about 70 wt % hydrocarbons and about 30 wt % of an alcohol (Nylosolv® A).

Following the washout operation, the plates, which still contain solvent, were dried at 60-65° C. for 90 minutes in accordance with the product-specific recommendations, and then post-exposed in the post-exposure unit of a Nyloflex® F III exposure unit by using UVA and UVC light. The purpose of the post-exposure is on the one hand to react residual amounts of monomer and photoinitiator that are still reactive, and secondly it makes the plate surface more tack-free.

Evaluation of the plate revealed that in general primarily rounded halftone dots were observable. Low halftone values can no longer be imaged on the plate at all. At a halftone spacing of 60 L/cm, the smallest halftone value imaged is 7%.

COMPARATIVE EXAMPLE 2

Digitally Imageable Flexographic Printing Element with a 3 µm Barrier Layer of Polyvinyl Alcohol A film element was first prepared, comprising the following layers disposed one above another:
a Mylar® A PET film 100 µm thick;
a digitally imageable mask layer 3.2 µm thick, comprising a polymeric binder and carbon black;
an oxygen-blocking layer 3.0 µm thick, comprising a polyvinyl alcohol (degree of hydrolysis: about 98 mol %).

The digitally imageable mask layer was obtained as follows:
First of all a solution was prepared from 91 kg of toluene, 91 kg n-propanol, and 23 kg of benzyl alcohol. This solvent mixture was then heated to 70° C. Added to this solution were 23.4 kg of a soft elastic polyamide (Macromelt® 6900). Subsequently, 12.6 kg of Spezial Schwarz 4 carbon black were added in 4 portions with stirring (one portion per hour). After the last portion, the dispersion was stirred at 70° C. for 24 h and then cooled to 30° C. Thereafter the reaction batch was milled for 5 h with a stirred ball mill at 240 kg/h throughput, and filtered through a 10 µm filter. The reaction solution was briefly stirred and then applied with a wet application of 130 µm at a speed of 6.3 m/min to the Mylar® PET film 100 µm thick. The dry film thickness was 3.2 µm, obtained via gravimetric measurements.

The oxygen-blocking layer was obtained as follows:
A solution of 0.0123 g of a commercial, nonionic, fluorine-containing surfactant (Capstone® FS-30) was initially dissolved in 4.50 g of n-propanol. Then this solution was added to 85.5 g of water. Added with stirring to these 90 parts of solvent mixture (95 parts water, 5 parts n-propanol) were 5 parts of a polyvinyl alcohol (polyvinyl alcohol from polyvinyl acetate, degree of hydrolysis about 98 mol %, $M_w$ about 27 000 g/mol; Mowiol® 4-98), and the resultant dispersion was heated under reflux at 80° C. for 2 h (IKA HBR4 digital 80° C. 400 rpm heating bath liquid, IKA RW20 500 rpm). The coating solution, cooled to room temperature, was then applied at a rate of 33.7 mm/s with a wet application of 65 µm to the imageable mask layer, which was located on a PET film 100 µm thick, by knifecoating. The dry film thickness was 3.0 µm, as determined gravimetrically.

The film element described was laminated onto the photopolymerizable layer of a Nyloflex® ACE 114 flexographic printing plate. For this purpose, top film and the thin release layer were peeled from the flexographic printing plate. The film element was laminated onto the photopolymerizable surface using a laminator. The temperature of the laminator rolls was set at 110° C. The assembly was also conditioned at 65° C. for 3 h.

The flexographic printing element was first pre-exposed for 10 seconds on the reverse side. The top film was peeled off. After reverse-side pre-exposure, the flexographic printing element was applied to the rotatable drum of an IR laser ("nano" laser, Flexolaser GmbH). The laser drum had a diameter of about 500 mm. Numerous cracks formed on the surface of the flexographic printing element during this procedure. A test motif was subsequently written into the mask layer, using the IR laser. After demounting of the flexographic printing element from the laser drum, as well as numerous cracks, there were also fine corrugated structures visible on the surface of the flexographic printing element.

The imaged flexographic printing element was subsequently exposed to actinic UV radiation for 14 minutes in analogy to comparative experiment 1.

An attempt was then made to wash out the exposed flexographic printing element, in the same way as for comparative experiment 1, using a commercial washout medium composed of about 70 wt % hydrocarbons and about 30 wt % of an alcohol (Nylosolv® A). Washout, however, was not possible. The blocking layer of polyvinyl alcohol could not be removed with the washout medium, instead remaining on the relief-forming layer (B).

Washout therefore took place in a plurality of steps. First of all, the remnants of the laser-ablatable mask layer were washed off with benzyl alcohol, after which the blocking layer was removed using water, and, lastly, the relief was produced by washout in Nylosolv® (as in comparative example 1).

The resultant flexographic printing plate was completely unusable for printing. Admittedly, evaluation of the plate showed that very fine halftones on the plate were imaged. The smallest halftone value imaged was 0.4% at a halftone spacing of 60 L/cm. The individual halftone dots had flat surfaces and sharp edges. The contours of the halftone dots reproduced the individual dots of the laser imaging. The cracks formed in the course of mounting to the laser drum, and also the fine corrugated structure, however, were also visible on the surface of the plate, and would result in grave defects in the printed image.

INVENTIVE EXAMPLE 1

Digitally Imageable Flexographic Printing Element with a 150 nm Barrier Layer of Polyvinyl Alcohol A film element was first prepared, comprising the following layers disposed one above another:
a Mylar® A PET film 100 µm thick;
a digitally imageable mask layer 3.2 µm thick, comprising a polymeric binder and carbon black;
an oxygen-blocking layer 0.15 µm thick, comprising a polyvinyl alcohol (degree of hydrolysis: about 98 mol %).

The imageable mask layer was obtained as described in comparative example 2.

The oxygen-blocking layer was obtained as follows:

A solution of 0.0121 g of a commercial, nonionic, fluorine-containing surfactant (Capstone® FS-30) was initially dissolved in 4.99 g of n-propanol. Then this solution was added to 94.81 g of water. Added with stirring to these 99.8 parts of solvent mixture (95 parts water, 5 parts n-propanol) was 0.2 part of a polyvinyl alcohol (polyvinyl alcohol from polyvinyl acetate, degree of hydrolysis about 98 mol %, $M_w$ about 27 000 g/mol; Mowiol® 4-98), and the resultant dispersion was heated under reflux at 80° C. for 2 h (IKA HBR4 digital 80° C. 400 rpm heating bath liquid, IKA RW20 500 rpm). The coating solution, cooled to room temperature, was then applied at a rate of 33.7 mm/s with a wet application of 75 µm to the imageable mask layer, which was located on a PET film 100 µm thick, by knifecoating. The dry film thickness was 0.15 µm, obtained via reflection measurements.

The film element described was laminated as described in comparative example 2 onto the photopolymerizable layer of a Nyloflex® ACE 114 flexographic printing plate. The assembly was also conditioned at 65° C. for 3 h.

The flexographic printing element was first pre-exposed for 10 seconds on the reverse side. The top film was peeled off. After reverse-side pre-exposure, the flexographic printing element was applied in analogy to comparative experiment 2 to the rotatable drum of an IR laser ("nano", Flexolaser GmbH). In contrast to comparative example 2, no cracks were formed. The flexographic printing plate was just as flexible as without blocking layer. A test motif was then written into the mask layer using the IR laser. Following demounting from the laser drum, the surface of the flexographic printing element was undamaged and carried no structure at all.

The imaged flexographic printing element was subsequently exposed to actinic UV radiation for 14 minutes in analogy to comparative experiment 1.

The exposed flexographic printing element was subsequently, in the same way as in the case of comparative experiment 1, washed out with a commercial washout medium composed of about 70 wt % hydrocarbons and about 30 wt % of an alcohol (Nylosolv® A), dried, and post-exposed. The resulting flexographic printing plate gave outstanding print outcomes. Evaluation of the plate showed that very fine halftones on the plate were imaged. The smallest imaged halftone value was 0.4% at a halftone spacing of 60 L/cm. The individual halftone dots had flat surfaces and sharp edges. The contours of the halftone dots reproduced the individual image dots of the laser imaging.

INVENTIVE EXAMPLE 2

Digitally Imageable Flexographic Printing Element with PVA Barrier Layer 150 nm Thick and Additional Polyamide Protective Layer 2 µm Thick In a first step, a transparent protective layer was produced on a temporary Mylar film as follows:

A solution of 4 parts toluene, 4 parts n-propanol and 1 part benzyl alcohol was prepared. This solvent mixture was then heated to 70° C. Added to this solution (98 parts) were 2 parts of a commercial, soft elastic polyamide (Macromelt® 6900), and heating was carried out under reflux for 2 h (IKA HBR4 digital 80° C. 400 rpm heating bath liquid, IKA RW20 500 rpm). After cooling to room temperature, the coating solution was knife-coated at a rate of 33.7 mm/s with a wet application of 75 μm onto a PET film 100 μm thick. The dry film thickness was 2.0 μm, determined gravimetrically.

The oxygen-blocking barrier layer was applied to the transparent protective layer as in inventive example 1.

The resulting top element is laminated onto the photopolymerizable layer of a Nyloflex® ACE 114 flexographic printing plate.

A laser-imageable mask layer is applied as in comparative example 2 to a 100 μm Mylar® PET film.

The temporary Mylar film is peeled from the flexographic printing plate. The laser-imageable mask layer is then laminated on.

This gives a flexographic printing element having the following construction (from top to bottom):
a Mylar® A PET film 100 μm thick;
a digitally imageable mask layer 3.2 μm thick, containing a polymeric binder and carbon black;
a transparent protective layer 2.0 μm thick, containing a soft elastic polyamide;
an oxygen-blocking layer 0.15 μm thick, containing a polyvinyl alcohol
a photopolymerizable layer 965 μm thick
a PET support film 175 μm thick.

The flexographic printing element was first pre-exposed for 10 seconds on the reverse side. The top film was peeled off. After reverse-side pre-exposure, the flexographic printing element was applied in analogy to comparative experiment 2 to the rotatable drum of an IR laser ("nano" laser, Flexolaser GmbH). In contrast to comparative example 2, no cracks were formed. The flexographic printing plate was just as flexible as without blocking layer. A test motif was subsequently written into the mask layer, using the IR laser.

The imaged flexographic printing element was subsequently exposed to actinic UV radiation for 14 minutes in analogy to comparative experiment 1.

An attempt was then made to wash out the exposed flexographic printing element, in the same way as for comparative experiment 1, using a commercial washout medium composed of about 70 wt % hydrocarbons and about 30 wt % of an alcohol (Nylosolv® A).

Washout in Nylosolv® was possible as in comparative example 1.

The flexographic printing plate obtained was outstandingly suitable for printing. Evaluation of the plate showed that very fine halftones on the plate were imaged. The smallest halftone value imaged was 0.4% at a halftone spacing of 60 L/cm. The individual halftone dots had flat surfaces and sharp edges. The contours of the halftone dots reproduced the individual pixels of the laser imaging. The surface of the plate was flawless.

INVENTIVE EXAMPLE 3

Flexographic Printing Element with an about 300 nm Barrier Layer of a Highly Hydrolyzed Polyvinyl Acetate Copolymer A film element was first prepared, comprising the following layers disposed one above another:
a Mylar® A PET film 100 μm thick;
a digitally imageable mask layer 3.2 μm thick, comprising a polymeric binder and carbon black;
an oxygen-blocking layer 0.30 μm thick, comprising a highly hydrolyzed polyvinyl acetate copolymer.

The imageable mask layer was obtained as described in comparative example 2.

The oxygen-blocking layer was obtained as follows:
0.5 part of a highly hydrolyzed polyvinyl acetate copolymer (Alcotex® 72.5, degree of hydrolysis 72.5 mol %) was added with stirring to 99.5 parts of a solvent mixture of water and n-propanol in a ratio of 1:1. Then 0.01 part of a commercial, nonionic, fluorine-containing surfactant (Capstone@ FS-30) was added and the resulting dispersion was heated under reflux at 80° C. for 2 h (IKA HBR4 digital 80° C. 400 rpm heating bath liquid, IKA RW20 500 rpm). The coating solution, cooled to room temperature, was then applied at a rate of 33.7 mm/s with a wet application of 75 μm to the imageable mask layer, which was located on a PET film 100 μm thick, by knifecoating. The dry film thickness was 0.13 μm, obtained via reflection measurements.

The film element described was laminated as described in comparative example 2 onto the photopolymerizable layer of a nyloflex ACE 114 flexographic printing plate. The assembly was also conditioned at 65° C. for 3 h.

The flexographic printing element was first pre-exposed for 10 seconds on the reverse side. The top film was peeled off. After reverse-side pre-exposure, the flexographic printing element was applied in analogy to comparative experiment 2 to the rotatable drum of an IR laser. In contrast to comparative example 2, no cracks were formed. The flexographic printing plate was just as flexible as without blocking layer. A test motif was then written into the mask layer using the IR laser. Following demounting from the laser drum, the surface of the flexographic printing element was undamaged and carried no structure at all.

The imaged flexographic printing element was subsequently exposed to actinic UV radiation for 14 minutes in analogy to comparative experiment 1.

The exposed flexographic printing element was subsequently, in the same way as in the case of comparative experiment 1, washed out with a commercial washout medium composed of about 70 wt % hydrocarbons and about 30 wt % of an alcohol (Nylosolv® A), dried, and post-exposed. The evaluation of the plates revealed that much finer halftones were imaged on the plate than without blocking layer. The smallest imaged halftone value was 1.2% at a halftone spacing of 60 L/cm. The individual halftone dots had flat surfaces and sharp edges. The contours of the halftone dots reproduced the individual image dots of the laser imaging.

INVENTIVE EXAMPLE 4

Flexographic Printing Element with a 100 nm $SiO_x$ Barrier Layer

A film element was first prepared, comprising the following layers disposed one above another:
a Mylar® A PET film 100 μm thick;
a digitally imageable mask layer 3.2 μm thick, comprising a polymeric binder and carbon black;
an $SiO_x$ barrier layer 100 nm thick.

The imageable mask layer was obtained as described in comparative example 2.

The $SiO_x$ barrier layer was applied by the Ceramis® Coating Technology to the imageable mask layer. For this purpose, the polyester film coated with the mask layer was conveyed under high vacuum to an $SiO_x$ reservoir vessel.

The solid $SiO_x$ was vaporized by electron beams, and deposited on the cooled, coated film. The $SiO_x$-coated film element had a uniform, mall surface. The thickness of the $SiO_x$ coating, obtained by way of reflection measurements, amounted to about 100 nm.

The film element described was laminated as described in comparative example 2 onto the photopolymerizable layer of a Nyloflex® ACE 114 flexographic printing plate. The assembly was also conditioned at 65° C. for 3 h.

The flexographic printing element was first pre-exposed for 10 seconds on the reverse side. The top film was peeled off. After reverse-side pre-exposure, the flexographic printing element was applied in analogy to comparative experiment 2 to the rotatable drum of an IR laser. In contrast to comparative example 2, no cracks were formed. The flexographic printing plate was just as flexible as without blocking layer. A test motif was then written into the mask layer using the IR laser. Following demounting from the laser drum, the surface of the flexographic printing element was undamaged and carried no structure at all.

The imaged flexographic printing element was subsequently exposed to actinic UV radiation for 14 minutes in analogy to comparative experiment 1.

The exposed flexographic printing element was subsequently, in the same way as in the case of comparative experiment 1, washed out with a commercial washout medium composed of about 70 wt % hydrocarbons and about 30 wt % of an alcohol (Nylosolv® A), dried, and post-exposed. The evaluation of the plates revealed that much finer halftones were imaged on the plate than without blocking layer. The smallest imaged halftone value was 0.8% at a halftone spacing of 60 L/cm. The individual halftone dots had flat surfaces and sharp edges. The contours of the halftone dots reproduced the individual image dots of the laser imaging.

Table 1 below summarizes the results of the inventive and comparative examples.

TABLE 1

Summary of the results of the inventive and comparative examples

| No. | Barrier layer | Protective layer | Laserability | Washout | Halftone dot | First tonal value at 60 L/cm |
|---|---|---|---|---|---|---|
| C1 | — | — | ok | nylosolv ® | round | 7% |
| C2 | 3 µm polyvinyl alcohol | — | cracks | 1. benzyl alcohol, 2. water, 3. nylosolv ® | flat | 0.4% |
| Inv. ex. 1 | 150 nm polyvinyl alcohol | — | ok | nylosolv ® | flat | 0.4% |
| Inv. ex. 2 | 150 nm polyvinyl alcohol | 2 µm polyamide | ok | nylosolv ® | flat | 0.4% |
| Inv. ex. 3 | 300 nm poly(vinyl alcohol-vinyl acetate) | — | ok | nylosolv ® | flat | 1.2% |
| Inv. ex. 4 | 100 nm $SiO_x$ | — | ok | nylosolv ® | flat | 0.8% |

The inventive and comparative examples show that flexographic printing elements which have no barrier layer and are exposed in the presence of atmospheric oxygen exhibit unsatisfactory tonal values.

A polyvinyl alcohol barrier layer 3 µm thick does afford good tonal values, but, on imaging of the laser-ablatable mask layer by means of a drum laser, cracks are formed which lead to defects in the printed image.

Thin barrier layers of polyvinyl alcohol, poly(vinyl alcohol-vinyl acetate) copolymers, and $SiO_x$ result both in satisfactory tonal values and in defect-free printing.

What is claimed is:

1. A digitally imageable, photopolymerizable, flexographic printing element which is developable using hydrocarbon-comprising washout media and which comprises—disposed one above another in the order stated—at least
   (A) a dimensionally stable support film having a thickness from 50 µm to 300 µm,
   (B) a photopolymerizable, relief-forming layer from 300 µm to 6000 µm in thickness, which is soluble or dispersible in organic solvents and which comprises at least one elastomeric binder, an ethylenically unsaturated monomer, and a photoinitiator or a photoinitiator system,
   (C) a transparent barrier layer for oxygen,
   (D) a laser-ablatable mask layer from 1 µm to 4 µm in thickness, which is soluble or dispersible in organic solvents and comprises at least an elastic binder and UV/VIS light-absorbing materials, the layer thickness and/or the amount of light-absorbing materials being made such that the layer has an optical density for UV/VIS radiation is 2 to 4, and
   (E) a removable top film,
the barrier layer (C) being polar and being soluble in water and/or in water/alcohol mixtures comprising at least 50 wt % of water, and the barrier layer (C) having a thickness from 10 nm to 999 nm, wherein between the layers (C) and (D), the flexographic printing element comprises a transparent layer (X) for protecting the barrier layer (C) from laser radiation, the transparent layer (X) comprising at least one elastic, polymeric binder and having a thickness from 0.1 µm to 4 µm.

2. The flexographic printing element as claimed in claim 1, wherein the material of the barrier layer (C) comprises at least one material selected from the group consisting of polyvinyl alcohol, partly and highly hydrolyzed polyvinyl carboxylate, poly(ethylene oxide-vinyl alcohol) graft copolymers, and poly(ethylene-vinyl alcohol) copolymers.

3. The flexographic printing element as claimed in claim 1, wherein the material of the barrier layer (C) comprises inorganic metal and/or semimetal oxides.

4. The flexographic printing element as claimed in claim 3, wherein the semimetal oxide comprises silicon oxides.

5. The flexographic printing element as claimed in claim 1, wherein the oxygen permeability of the barrier layer (C) at 295 K is less than 100 $(cm^3 \times 100 \ \mu m)/(m^2 \times d \times bar)$.

6. The flexographic printing element as claimed in claim 1, wherein the thickness of the barrier layer (C) is from 100 nm to 400 nm.

7. The flexographic printing element as claimed in claim 1, wherein the thickness of the barrier layer (C) is from 100 nm to 249 nm.

8. The flexographic printing element as claimed in claim 1, wherein said elastic at least one binder of the laser-ablatable mask layer (D) comprises a soft elastic polyamide.

9. A method for producing flexographic printing plates which comprises using as starting material the flexographic printing element as claimed in claim 1, comprising at least the following method steps:
   (1) removing the top film (E),
   (2) writing a mask into the laser-ablatable mask layer (D) by means of an IR laser,
   (3) exposing the imaged flexographic printing element to UV or UV-VIS radiation through a resultant mask,
   (4) removing the remnants of the laser-ablatable mask layer (E), the transparent layer (X) where present, and the barrier layer (C) and also the unpolymerized fractions of the relief-forming layer (B), using a washout medium which comprises at least 60 wt % hydrocarbons,
   (5) drying the resultant flexographic printing plate, and
   (6) carrying out post-treatment with UV-A and/or UV-C light.

10. The method as claimed in claim 9, wherein the washout medium comprises 60 to 95 wt % hydrocarbons and 5 to 40 wt % alcohols.

11. The method as claimed in claim 9, wherein for method step (2) a laser apparatus comprising a rotatable drum is used and the flexographic printing element for imaging is mounted to the drum.

12. The method as claimed in claim 9, wherein for method step (3) a flatbed exposure unit is used.

13. The method as claimed in claim 9, wherein for method step (4) a flatbed washout apparatus is used.

14. The method as claimed in claim 12, wherein for method step (4) a flatbed washout apparatus is used.

* * * * *